(12) United States Patent
Kawano et al.

(10) Patent No.: US 6,190,840 B1
(45) Date of Patent: *Feb. 20, 2001

(54) RESIST PATTERN FORMING METHOD

(75) Inventors: Kenji Kawano; Shinichi Ito; Katsuya Okumura, all of Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/098,469

(22) Filed: Jun. 17, 1998

(30) Foreign Application Priority Data

Jun. 18, 1997 (JP) .................................... 9-161249
Jan. 30, 1998 (JP) .................................... 10-019256

(51) Int. Cl.⁷ ...................................... G03F 7/20
(52) U.S. Cl. .............................. 430/325; 430/326
(58) Field of Search ..................... 430/325, 326

(56) References Cited

U.S. PATENT DOCUMENTS 5,702,848 * 12/1997 Spence ..................................... 430/5

FOREIGN PATENT DOCUMENTS

| 196 33 407 | * | 2/1998 | (DE) . |
| 738 925 | * | 10/1996 | (EP) . |
| 7-320999 | | 12/1995 | (JP) . |
| 7-321001 | | 12/1995 | (JP) . |

* cited by examiner

Primary Examiner—Kathleen Duda
Assistant Examiner—Nicole Barreca
(74) Attorney, Agent, or Firm—Finnegan, Henderson, Farabow, Garrett & Dunner, L.L.P.

(57) ABSTRACT

A resist pattern forming method according to this invention is characterized by forming a resist film to have different thicknesses in one region and the other region in accordance with the pattern size or pattern density of a photomask. The resist pattern forming method according to this invention is characterized by selectively forming a resist film in part of a substrate region by applying a resist in part of the region without applying the resist in the remaining region. The resist pattern forming method according to this invention is characterized by selectively forming a resist film on part of a substrate on the basis of the intensity of exposure light observed at the resist film.

11 Claims, 9 Drawing Sheets

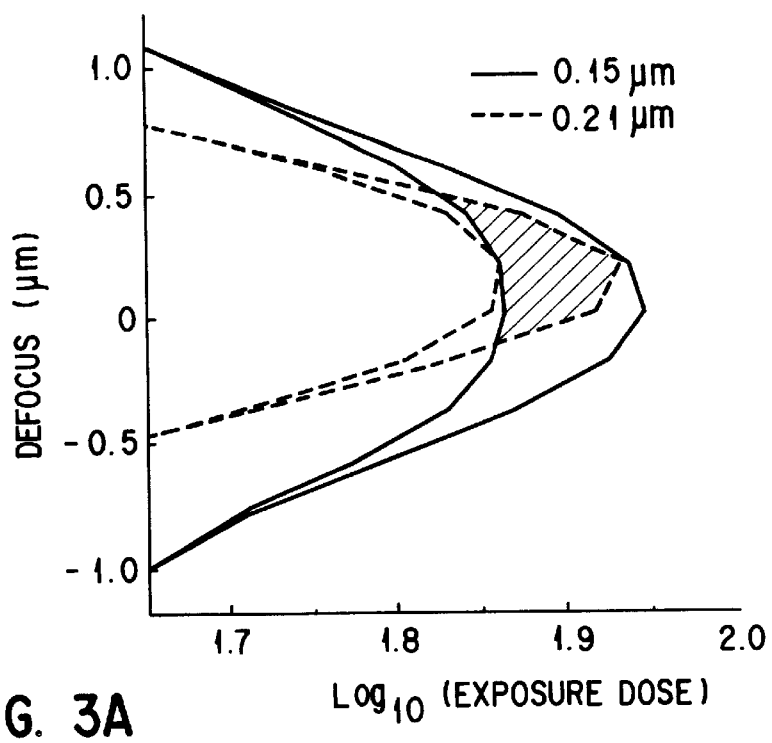
F I G. 3A

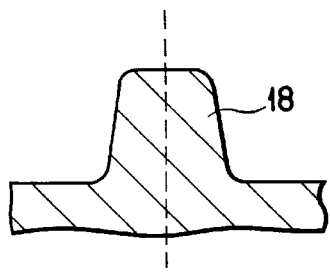
F I G. 10C
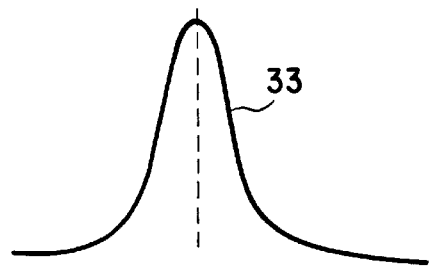
F I G. 10D
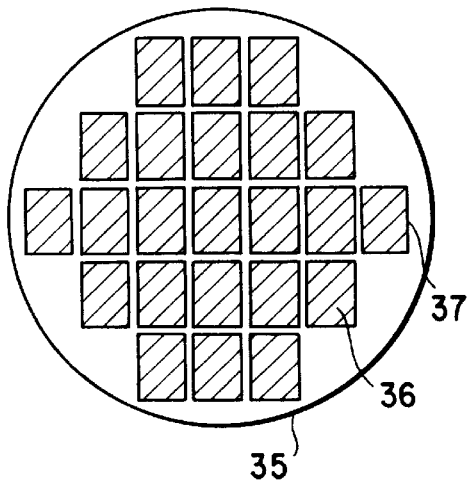
F I G. 11B

RESIST PATTERN FORMING METHOD

BACKGROUND OF THE INVENTION

The present invention relates to a resist pattern forming method used in manufacturing a semiconductor device and the like. In this specification, a resist means a photoresist.

In a photolithography process, a super-resolution exposure technique using a phase-shifting mask and the like must be applied to form a fine pattern with a width smaller than the wavelength of exposure light.

A Levenson phase-shifting mask comprises, e.g., a transparent substrate, light-shielding members arranged parallel to each other on the transparent substrate at predetermined intervals, and phase shifters arranged every other interval between adjacent light-shielding members. The Levenson phase-shifting mask is formed to attain a phase difference of 180° between exposure light transmitted through a transmitting portion not having a phase shifter, and exposure light transmitted through an adjacent transmitting portion having a phase shifter.

Of phase-shifting masks, the Levenson phase-shifting mask can form a periodic, high-density resist pattern at a higher resolution. With the use of the Levenson phase-shifting mask, a larger depth of focus (DOF) can be obtained.

However, when, e.g., the core of a semiconductor device is to be formed using the Levenson phase-shifting mask, transmitting portions having phase shifters or transmitting portions not having phase shifters may be partially adjacent to each other because the core pattern is complicated. No phase difference can be formed at the location where transmitting portions of the same type are adjacent to each other. At this location, the resolution cannot be increased. For this reason, the core pattern is formed with a relatively large size, whereas the cell pattern is generally formed with a size as small as possible.

In general, exposure light transmitted through a photomask diffracts or interferes, varying in intensity and the like. That is, the intensity of exposure light incident on a resist film is not uniform but varies at the entire irradiated portion. The intensity distribution (image intensity distribution) depends on diffraction and interference conditions, i.e., the pattern size and pattern density (duty ratio) of a light-transmitting portion formed on the photomask. Therefore, optimum conditions, such as the optimum exposure dose, for exposing the resist film formed on the substrate depend on the size and the density. Accordingly, it is difficult to expose both core and cell portions under optimum conditions in simultaneously forming them.

This problem occurs not only in the use of the Levenson phase-shifting mask but also in the use of a general photomask. Therefore, demands arise for a larger margin for exposure conditions such as the exposure dose in order to form a pattern at a higher precision in manufacturing a semiconductor device.

Prior to the exposure, a resist film must be formed on a substrate. A resist film is formed on the entire coating surface of a substrate by a spin coating method as a conventional resist coating method. The resist film is also applied on an alignment mark used to align the substrate, a photomask, and the like in exposure. As a result, the alignment precision decreases, and no resist pattern can be formed at a high precision.

In addition, since the resist film is formed on a region, such as the alignment mark, where no resist film need be formed, a larger amount of resist is required, resulting in high cost.

BRIEF SUMMARY OF THE INVENTION

It is an object of the present invention to provide a resist pattern forming method capable of forming a resist pattern at a high precision.

It is another object of the present invention to provide a resist pattern forming method capable of widening the margin for exposure conditions and increasing the throughput in simultaneously forming regions having different pattern sizes and different pattern densities.

It is still another object of the present invention to provide a resist pattern forming method capable of increasing the alignment precision in exposure.

It is still another object of the present invention to provide a resist pattern forming method capable of contributing to a cost reduction.

According to the present invention, there is provided a resist pattern forming method comprising the steps of forming a resist film on one major surface of a substrate, irradiating the resist film with exposure light via a photomask to expose the resist film, and developing the exposed resist film, wherein the photomask includes a first pattern portion having a light-transmitting portion, and a second pattern portion having a light-transmitting portion different in at least one of a pattern size and a pattern density from the first pattern portion, and the step of forming the resist film comprises forming first and second regions respectively corresponding to the first and second pattern portions of the resist film to have different thicknesses.

According to the present invention, there is provided a resist pattern forming method comprising the steps of forming a resist film selectively on part of one major surface of a substrate, thereby forming an applied region and a non-applied region in the major surface of the substrate, exposing the resist film using a photomask, and developing the exposed resist film.

According to the present invention, there is provided a resist pattern forming method comprising the steps of forming a resist film on one major surface of a substrate irradiating the resist film with exposure light via a photomask to expose the resist film, and developing the exposed resist film, wherein the resist film is made by using a positive resist, the major surface of the substrate consists of a first region where an intensity substantially equal to an intensity of the exposure light incident on the photomask is observed, and a second region as the other portion, and the resist film forming step comprises applying the resist on the second region, without applying on at least part of the first region.

According to the present invention, there is provided a resist pattern forming method comprising the steps of forming a resist film on one major surface of a substrate, irradiating the resist film with exposure light via a photomask to expose the resist film, and developing the exposed resist film, wherein the resist film is made by using a negative resist, the major surface of the substrate consists of a first region where an intensity of the exposure light observed is substantially equal to zero, and a second region as the other region, and the resist film forming step comprises applying the resist on the first region, without applying on at least part of the second region.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a graph showing the ED obtained using an example of the resist pattern forming method according to the first embodiment of the present invention;

FIG. 10C is a sectional view schematically showing an alignment mark when the resist pattern forming method according to the second embodiment of the present invention is used;

FIG. 10D is a view schematically showing the profile of scattered light from the alignment mark that is detected when the resist pattern forming method according to the second embodiment of the present invention is used;

FIG. 11B is a front view schematically showing a semiconductor wafer on which a resist film is formed using the resist pattern forming method according to the second embodiment of the present invention.

DETAILED DESCRIPTION OF THE INVENTION

The present invention will be described in detail below.

The first embodiment of the present invention will be described. In the first embodiment, the margin for exposure conditions is controlled by forming a resist film to have different thicknesses between one region and the other region in accordance with the pattern size or pattern density of a photomask.

Figure 1A:
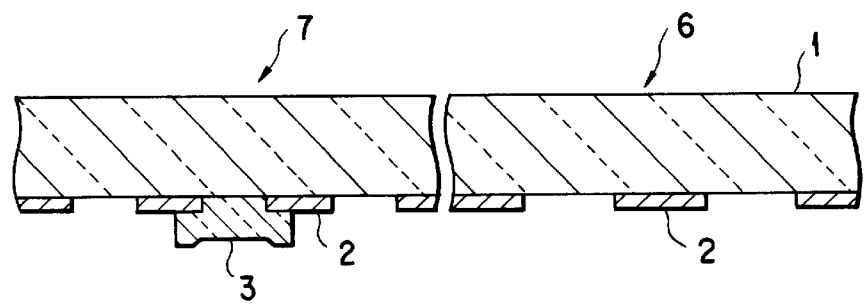
FIGS. 1A to 1C are sectional views, respectively, schematically showing an example of a resist pattern forming method according to the first embodiment of the present invention.
Figure 1B:
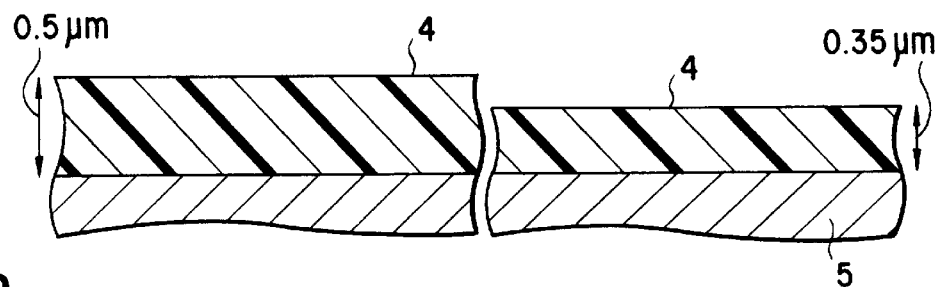
Figure 1C:
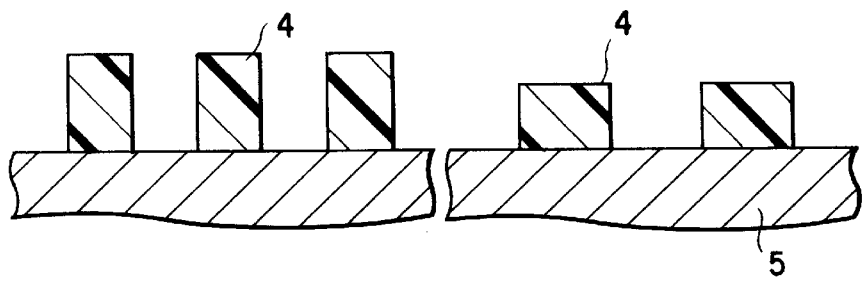

FIGS. 1A to 1C show an example of a resist pattern forming method according to the first embodiment of the present invention. FIGS. 1A to 1C are sectional views.

FIG. 1A shows a photomask. This photomask is a Levenson phase-shifting mask, which comprises a non-Levenson portion (non-phase-shifting portion) 6 and a Levenson portion (phase-shifting portion) 7.

The non-Levenson portion 6 is made up of a transparent substrate 1 made of, e.g., quartz, and light-shielding films 2 formed on the transparent substrate 1. The Levenson portion 7 is made up of light-shielding films 2 and a phase shifter 3 formed on the transparent substrate 1.

In FIG. 1A, the respective light-shielding films 2 have a band-like shape and are arranged parallel to each other at predetermined intervals. The phase shifter 3 is arranged on every other light-transmitting portion between adjacent light-shielding films 2.

The Levenson portion 7 is formed to attain a phase difference of 180° between exposure light transmitted through a light-transmitting portion on which the phase shifter 3 is formed, and exposure light transmitted through a light-transmitting portion on which no phase shifter 3 is formed.

Note that the width of each light-shielding film 2 and the interval between the light-shielding films 2 at the Levenson portion 7 are set smaller than those at the non-Levenson portion 6. That is, the pattern size at the Levenson portion 7 is smaller than that at the non-Levenson portion 6.

Since the structure and pattern size are different between the non-Levenson portion 6 and the Levenson portion 7, diffraction or interference conditions of exposure light are also different between them. The intensity profile is different between exposure light transmitted through the non-Levenson portion 6 and exposure light transmitted through the Levenson portion 7. Therefore, optimum exposure conditions such as the optimum exposure dose differs between the non-Levenson portion 6 and the Levenson portion 7. In other words, the allowable exposure condition range differs between the non-Levenson portion 6 and the Levenson portion 7.

In this case, as shown in FIG. 1B, the thickness of a resist film 4 formed on a semiconductor substrate 5 is set different between a region corresponding to the non-Levenson portion 6 and a region corresponding to the Levenson portion 7. With this setting, the overlapping allowable exposure condition ranges in these regions can be increased because optimum exposure conditions or the allowable exposure condition range depends on the thickness of the resist film 4.

Note that the thickness of the resist film 4 for either one of the region corresponding to the non-Levenson portion 6 and the region corresponding to the Levenson portion 7 is determined on the basis of at least one of the wavelength of exposure light, the numerical aperture of an optical projection system, the coherence factor, the intensity of exposure light observed on the resist film, the optical constant of the resist, the resist dissolving properties, and the resist developing time.

By performing exposure processing under the above conditions and developing processing, the resist pattern 4 having a rectangular section and a desired size can be formed, as shown in FIG. 1C.

It is very difficult to form the resist film 4 having partially different thicknesses as shown in FIG. 1B, by a conventional spin coating method. To form the resist film 4, another resist coating method different from the conventional spin coating method must be employed.

A known resist coating method except for the conventional spin coating method is as follow. For example, Jpn. Pat. Appln. KOKAI Publication No. 7-3299 discloses a coating film forming method and apparatus for realizing a uniform thickness of a coating film and a reduction in use amount of a coating solution. According to this reference, the thickness of the coating film is made uniform by respectively applying a solvent and a coating solution (resist) onto a substrate rotating at different rotational speeds. By setting the amount of the coating solution in accordance with the rotational speed, the use amount of the coating solution can be decreased.

Jpn. Pat. Appln. KOKAI Publication No. 7-321001 discloses a resist coating apparatus having a spray head on which many spray holes are aligned. This apparatus applies a resist such that the resist is sprayed from each spray hole to a substrate while the spray head is moved parallel to the surface of the substrate therebelow. According to this apparatus, the resist use amount can be decreased.

However, the objects of these disclosures are to make the thickness of the resist film uniform and to decrease the resist use amount. These references do not disclose any method of forming the resist film 4 having partially different thicknesses.

As a resist coating method for realizing this, a spot coating method is available. According to the spot coating method, a resist can be locally applied. For example, the resist is sprayed from many small holes arranged in a matrix so as to form spots while the resist spray amount is controlled for each small hole, thereby forming a resist film.

Figure 2:
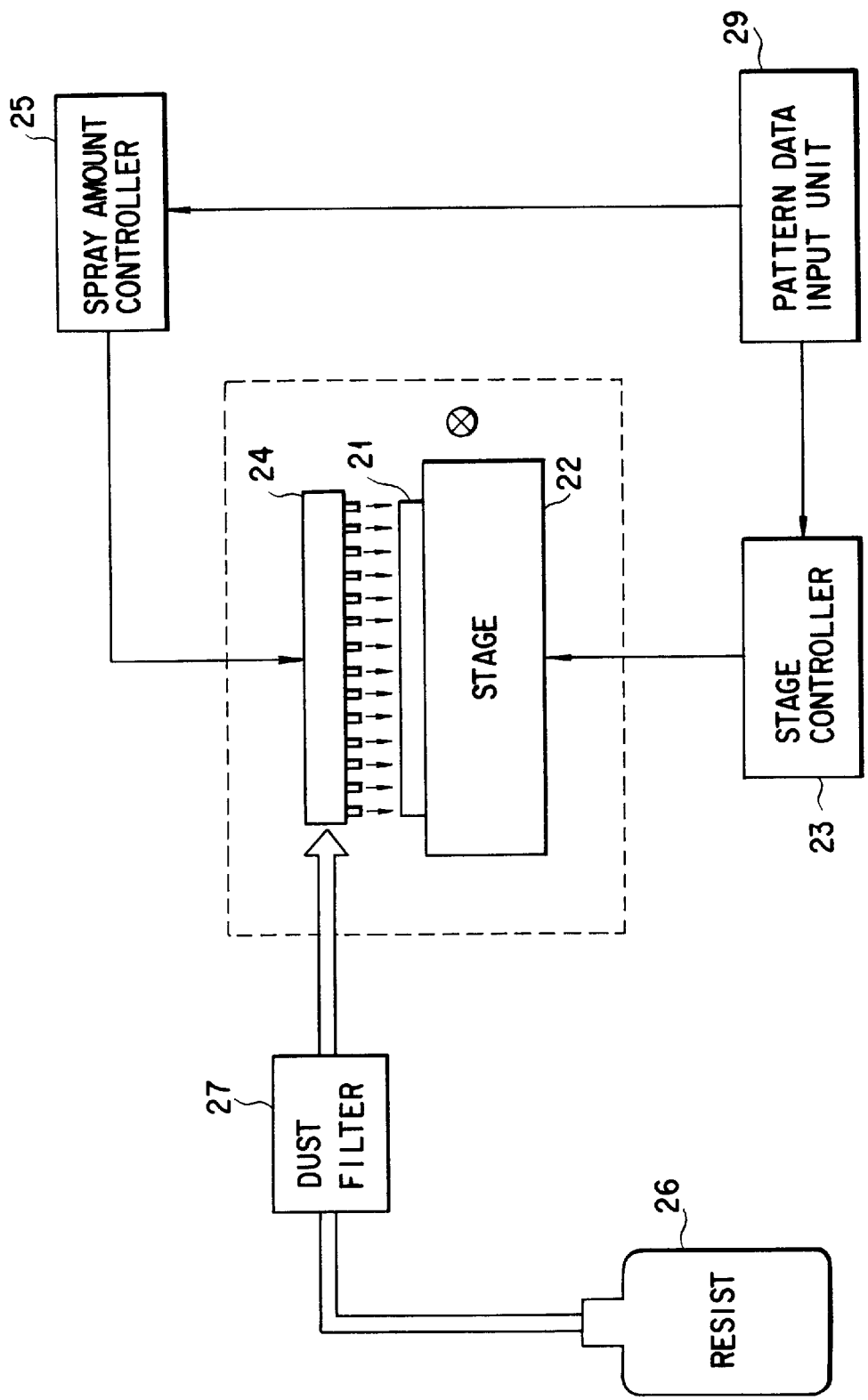
FIG. 2 is a block diagram schematically showing an example of a resist coating apparatus used in the resist pattern forming method according to the first to third embodiments of the present invention.

The resist can be applied by the spot coating method using, e.g., an apparatus shown in FIG. 2.

FIG. 2 schematically shows an example of a resist coating apparatus used in the resist pattern forming method according to the first to third embodiments. In FIG. 2, a semiconductor substrate 21 serving as a substrate to be processed is placed on a stage 22. The stage 22 can move the substrate 21 in the x direction (direction perpendicular to the sheet surface of the drawing). This movement is controlled by a stage controller 23 connected to the stage 22.

A spray head 24 on which many spray holes are aligned in a line is set above the stage 22. The spray head 24 is connected via a dust filter 27 to a vessel 26 containing a resist. The resist contained in the vessel 26 can be supplied to the spray head 24 via the dust filter, where an impurity of the resist is removed, and sprayed from the spray holes to the substrate 21 so as to form spots.

A spray amount controller 25 is connected to the spray head 24 and controls the resist spray amount from the spray holes for each spray hole. A data input unit 29 is connected to the stage controller 23 and the spray amount controller 25. The data input unit 29 supplies data necessary to form a resist film with a desired shape, to the controllers 23 and 25.

According to the resist coating apparatus described above, a resist film can be formed on the substrate 21 by spraying a resist from each spray hole while the substrate 21 is moved in the x direction. The resist film can be selectively formed with a desired thickness in a desired region on the substrate 21 by controlling either one or both of the moving speed of the substrate 21 and the resist spray amount from each spray hole on the basis of data supplied from the data input unit 29 to the controllers 23 and 25.

In forming a resist film using the above apparatus, the dependency of the relationship between the pattern size or pattern density of a resist film to be formed and exposure conditions on the thickness of the resist film is desirably examined strictly in advance by a simulation, experiment, or the like. In addition, the relationship between the moving speed of the substrate 21, the resist spray amount, and the thickness of the resist film is preferably examined strictly in advance by a simulation, experiment, or the like.

A resist film is formed by the following method using the above-described apparatus.

A Levenson phase-shifting mask shown in FIG. 1A was formed to have a line & space (L&S) width of 0.21 $\mu$m at the non-Levenson portion 6 and an L&S width of 0.15 $\mu$m at the Levenson portion 7. Note that the size is given as a converted value obtained when the pattern is transferred onto the substrate. As shown in FIG. 1B, a resist film 4 was formed on a semiconductor substrate 5 using the apparatus shown in FIG. 2. The resist film 4 had a thickness of 0.35 $\mu$m in the region corresponding to the non-Levenson portion 6 and a thickness of 0.5 $\mu$m in the region corresponding to the Levenson portion 7. As the resist, a chemically amplified negative resist (TDUR-N9 available from TOKYO OHKA KOGYO CO., LTD.) was used.

As for the resist film 4 formed in the above manner, the relationship between exposure conditions (exposure dose and focal point) and pattern data (pattern size) of the mask was examined under the following conditions. That is, a KrF laser beam (wavelength: 248 nm) was used as exposure light, the numerical aperture (NA) of the optical projection system was set to 0.55, the coherence factor ($\sigma$) was set to 0.4, and the developing time of the resist film 4 was set to 60 sec.

FIG. 3A shows the ED (Exposure Defocus) obtained in the above manner.

Figure 3B:
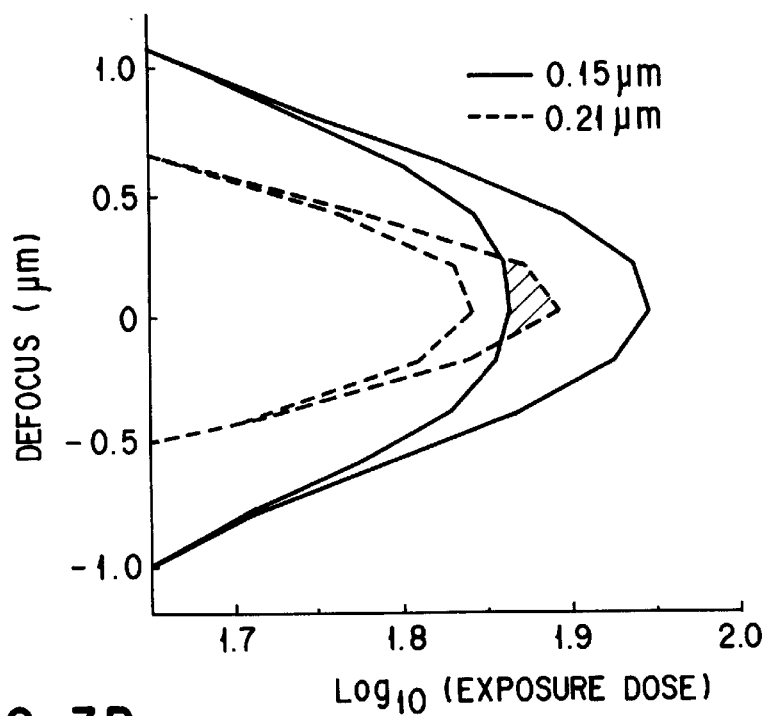
FIG. 3B is a graph showing the ED obtained using a conventional resist pattern forming method.

By a conventional resist pattern forming method, a resist film was formed in the above manner except that its thickness was 0.5 $\mu$m in the entire region. The relationship between exposure conditions and pattern data was examined. FIG. 3B shows the ED obtained using the conventional resist pattern forming method.

In FIGS. 3A and 3B, the abscissa indicates the defocus position, and the ordinate indicates $\log_{10}$ (exposure dose). In FIGS. 3A and 3B, the region surrounded by two solid lines represents an exposure condition range wherein the line width of the resist pattern formed using the Levenson portion 7 shifts from the target value within ±10%. The region surrounded by two broken lines represents an exposure condition range wherein the line width of the resist pattern formed using the non-Levenson portion 6 shifts from the target value within ±10%.

In FIG. 3B, the allowable exposure condition range related to the Levenson portion (L&S width=0.15 μm) slightly overlaps the allowable exposure condition range related to the non-Levenson portion (L&S width=0.21 μm). That is, when a resist film is simultaneously exposed to a pattern corresponding to the Levenson portion and a pattern corresponding to the non-Levenson portion, the allowable exposure condition is limited to a hatched region.

In FIG. 3A, the allowable exposure condition range related to the non-Levenson portion shifts to the right (because a negative resist is used as a resist), and extends along the ordinate. As a result, the hatched region is widened. That is, the exposure dose margin and the focus margin greatly increase.

Figure 4:
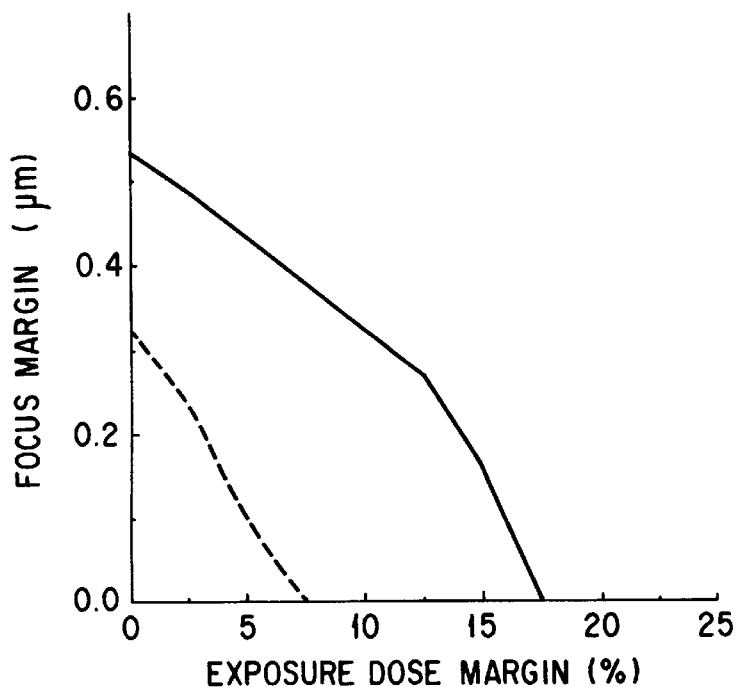
FIG. 4 is a graph showing the relationship between the exposure dose margin and the focus margin obtained using an example of the resist pattern forming method according to the first embodiment of the present invention.

FIG. 4 is a graph showing the exposure condition margin. FIG. 4 shows the relationship between the exposure dose margin and the focus margin that is obtained from the hatched regions in FIGS. 3A and 3B. In FIG. 4, the abscissa indicates the exposure dose margin, and the ordinate indicates the focus margin. A solid curved line represents data obtained from FIG. 3A, and a broken curved line represents data obtained from FIG. 3B.

As is apparent from FIG. 4, according to the first embodiment, the exposure dose margin and the focus margin greatly increase, compared to the conventional method. For example, for an exposure dose margin of 5%, the focus margin in the first embodiment is 4.2 times as large as the focus margin in the conventional method.

As described above, the pattern size is different between the non-Levenson portion 6 and the Levenson portion 7, and the exposure dose margin and the focus margin can be increased by forming the resist film 4 to have different thickness between the regions. The same goes for the case where the pattern density differs between the portions 6 and 7.

In the first embodiment, a Levenson phase-shifting mask having a Levenson portion and a non-Levenson portion is used as a photomask, and a negative resist is used as a resist. In this case, a resist film is made thinner in the region corresponding to the non-Levenson portion than in the region corresponding to the Levenson portion. With this setting, the margin for exposure conditions (an exposure dose and a focus) required to simultaneously expose the two regions becomes larger than the margin when a resist film is formed with a uniform thickness. Accordingly, the throughput increases.

In the first embodiment, the Levenson phase-shifting mask is used as a photomask, but a halftone phase-shifting mask can also be used. A resist pattern forming method using a halftone phase-shifting mask will be explained below with reference to FIGS. 5A to 5C. Note that the same description as that of the Levenson phase-shifting mask will be omitted.

Figure 5A:
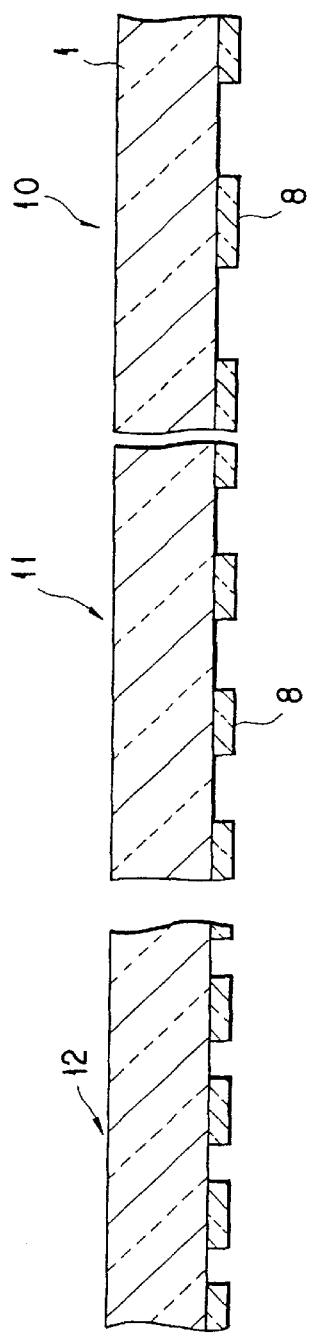
FIGS. 5A to 5C are sectional views, respectively, schematically showing another example of the resist pattern forming method according to the first embodiment of the present invention.
Figure 5B:
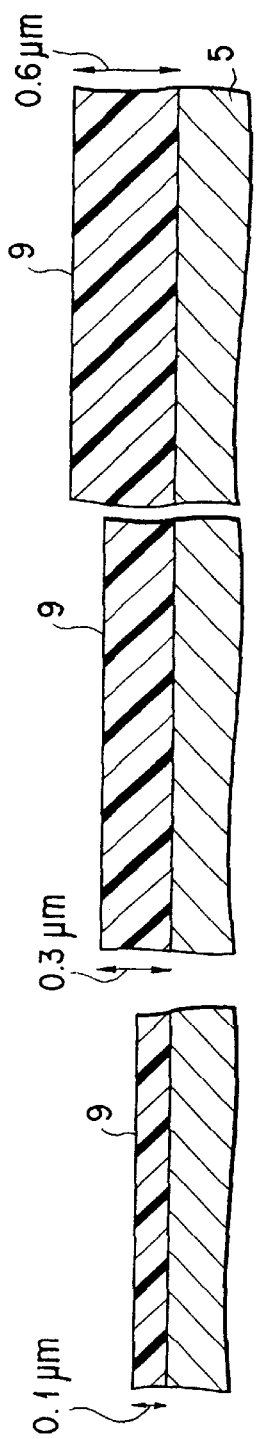
Figure 5C:
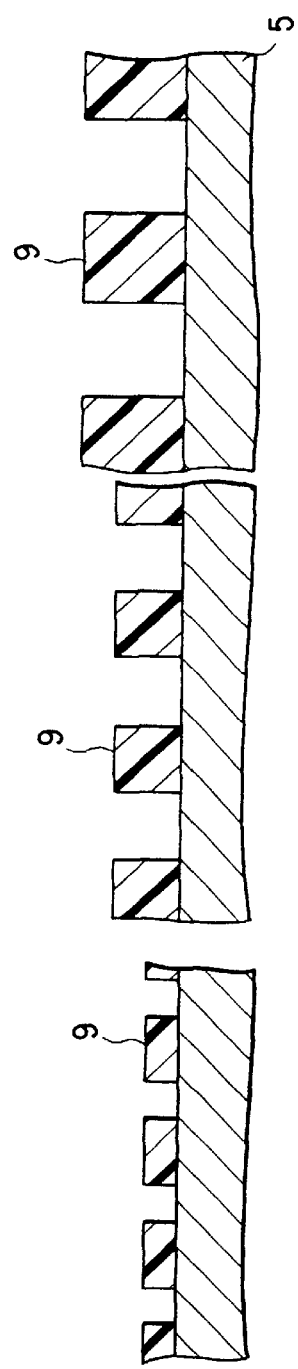

FIGS. 5A to 5D show another example of the resist pattern forming method according to the first embodiment of the present invention. FIGS. 5A to 5C are sectional views.

FIG. 5A shows a photomask. This photomask is a halftone phase-shifting mask and is constituted by forming band-like halftone films 8 on a transparent substrate 1 made of, e.g., silica at predetermined intervals. The pattern size and pattern density are different among a pattern portion 10, a pattern portion 11, and a pattern portion 12.

The halftone phase-shifting mask shown in FIG. 5A was formed to have an L&S width of 0.25 μm at the pattern portion 10, an L&S width of 0.21 μm at the pattern portion 11, and a line width of 0.21 μm and a space width of 0.19 μm at the pattern portion 12. As shown in FIG. 5B, a resist film 9 was formed on a semiconductor substrate 5 using the apparatus shown in FIG. 2 by the same method as described in the first embodiment. The resist film 9 had a thickness of 0.6 μm in a region corresponding to the pattern portion 10, a thickness of 0.3 μm in a region corresponding to the pattern portion 11, and a thickness of 0.1 μm in a region corresponding to the pattern portion 12. As the resist, a chemically amplified positive resist (optical constants n=1.78 and k=0.02 for a wavelength of 248 nm) was used.

The resist film 9 formed in the above manner was shaped into a resist pattern shown in FIG. 5C. The relationship between exposure conditions (exposure dose and focal point) and pattern data (pattern size, pattern density, and the like) of the mask was examined under the following conditions. That is, a KrF laser beam (wavelength: 248 nm) was used as exposure light, the NA was set to 0.6, σ was set to 0.75, and the developing time of the resist film 9 was set to 90 sec.

Figure 6A:
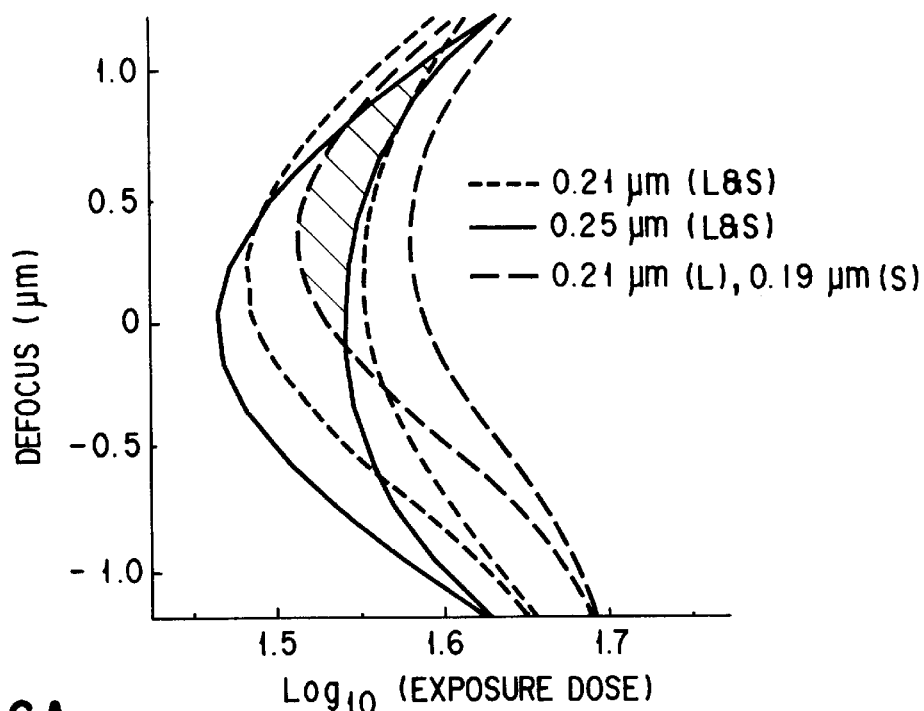
FIG. 6A is a graph showing the ED obtained using the example of the resist pattern forming method in FIGS. 5A to 5C according to the first embodiment of the present invention.

FIG. 6A shows the ED (Exposure Defocus) obtained in the above manner.

Figure 6B:
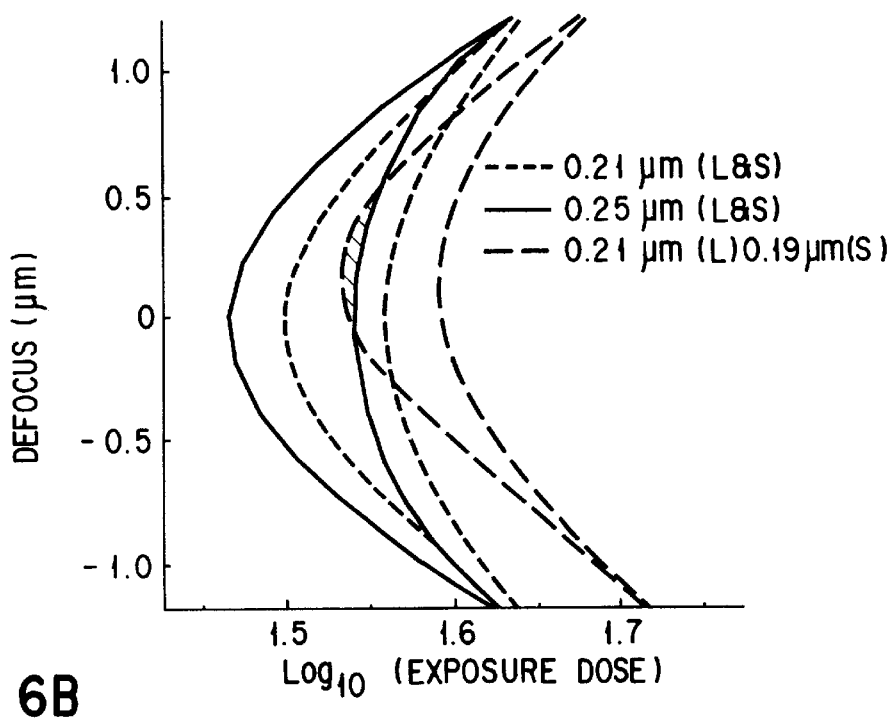
FIG. 6B is a graph showing the ED obtained using the conventional resist pattern forming method.

By a conventional resist pattern forming method, a resist film was formed in the above manner except that its thickness was 0.6 μm in the entire region. The relationship between exposure conditions and pattern data was examined. FIG. 6B shows the ED obtained using the conventional resist pattern forming method.

In FIGS. 6A and 6B, the abscissa indicates the defocus position, and the ordinate indicates $\log_{10}$ (exposure dose). In FIGS. 6A and 6B, the region surrounded by two solid lines represents an exposure condition range wherein the line width of the resist pattern formed using the pattern portion 10 shifts from the target value within ±10%. The region surrounded by two short dashed lines represents an exposure condition range wherein the line width of the resist pattern formed using the pattern portion 11 shifts from the target value within ±10%. The region surrounded by two long dashed lines represents an exposure condition range wherein the line width of the resist pattern formed using the pattern portion 12 shifts from the target value within ±10%.

In FIG. 6B, the allowable exposure condition range related to the pattern portion 10 (L&S width=0.25 μm), the allowable exposure condition range related to the pattern portion 11 (L&S width=0.21 μm), and the allowable exposure condition range related to the pattern portion 12 (line width=0.21 μm, space width=0.19 μm) overlap slightly. That is, when a resist film is simultaneously exposed to patterns corresponding to the pattern portion 10, 11 and 12, the allowable exposure condition is limited to a hatched region.

In FIG. 6A, since the pattern portions 11 and 12 are made thinner, the allowable exposure condition ranges related to the pattern portion 11 and 12 shift to the left and extend along the ordinate. As a result, the hatched region is widened. That is, the exposure dose margin and the focus margin greatly increase.

Figure 7:
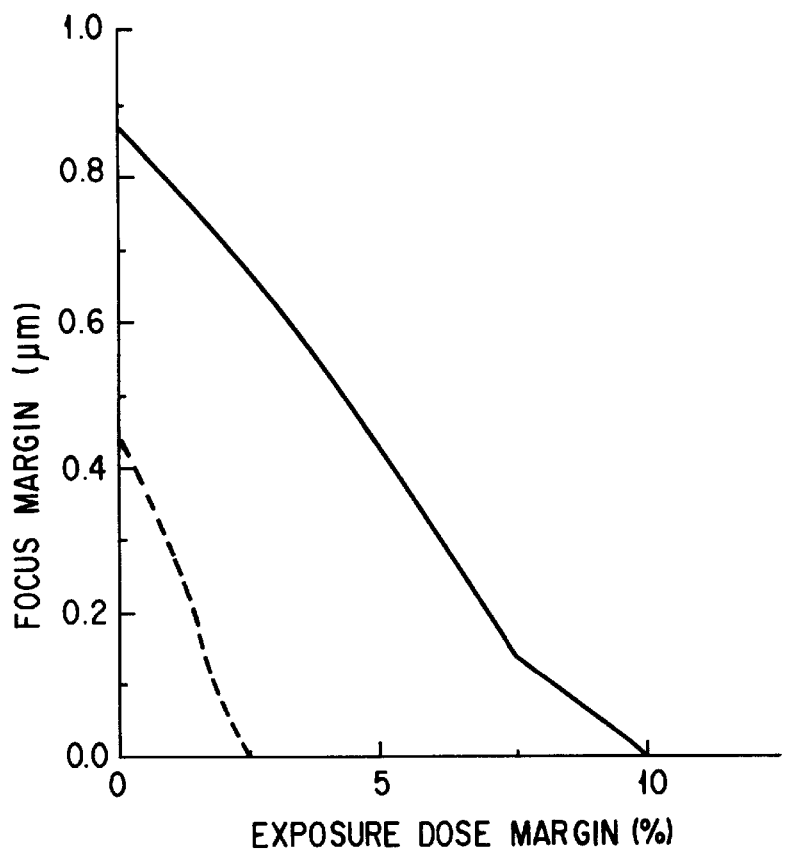
FIG. 7 is a graph showing the relationship between the exposure dose margin and the focus margin obtained using the example of the resist pattern forming method in FIG. 5A to 5C according to the first embodiment of the present invention.

FIG. 7 is a graph showing the exposure dose margin and the focus margin. FIG. 7 shows the relationship between the exposure dose margin and the focus margin that is obtained from the hatched regions in FIGS. 6A and 6B. In FIG. 7, the abscissa indicates the exposure dose margin, and the ordinate indicates the focus margin. A solid curved line represents data obtained from FIG. 6A, and a broken curved line represents data obtained from FIG. 6B.

As is apparent from FIG. 7, according to the first embodiment, the exposure dose margin and the focus margin greatly increase, compared to the conventional method. For example, for an exposure dose margin of 5%, according to the conventional method, the focus margin is equal to zero. On the other hand, according to the first embodiment, it is possible to obtain a lager focus margin as much as 0.4 μm.

In the first embodiment, the halftone phase-shifting mask having a plurality of pattern portions with different pattern sizes and different pattern densities is used as a photomask, and a positive resist is used as a resist. In this case, a resist film is made thinner in a region corresponding to a pattern portion with a smaller size or in a region where removing ratio is lower than in a region corresponding to a pattern portion with a larger size or in a region where removing ratio is higher. With this setting, the margin for exposure conditions (an exposure dose and a focus) required to simultaneously expose the three regions becomes larger than the margin when a resist film is formed with a uniform thickness. In other words, the throughput increases.

In the first embodiment, the Levenson phase-shifting mask or the halftone phase-shifting mask is used as a photomask. In addition to them, a general photomask used to form a resist pattern is available. For example, a phase-shifting mask such as a self-align phase-shifting mask or a phase edge line mask can be used. Further, a light-shielding mask and the like can be used.

The second embodiment of the present invention will be described. In the second embodiment, a resist film is selectively formed in part of a substrate region by applying a resist in part of the region without applying the resist in the remaining region.

Figure 8:
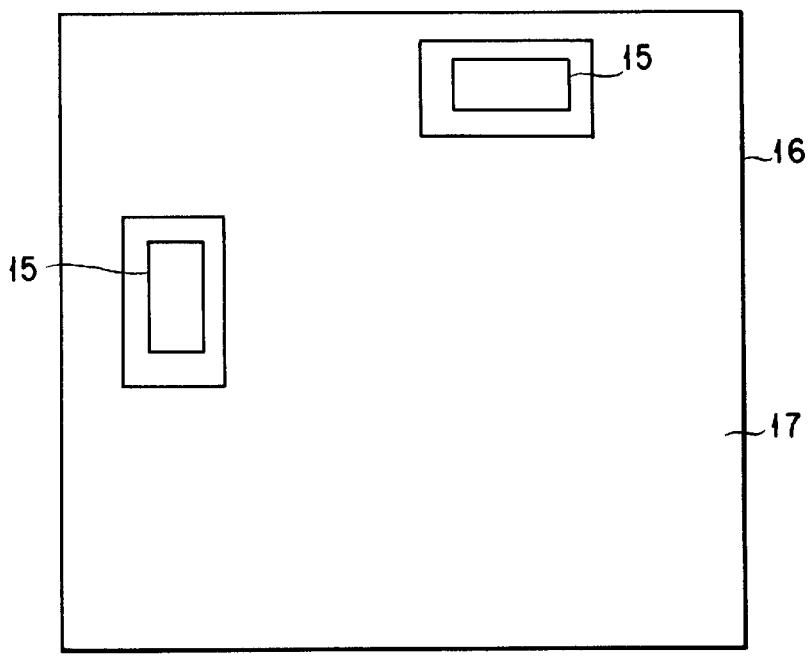
FIG. 8 is a plan view schematically showing an example of a resist pattern forming method according to the second embodiment of the present invention.

FIG. 8 is a plan view schematically showing an example of a resist pattern forming method according to the second embodiment of the present invention.

In FIG. 8, reference numeral 15 denotes an alignment mark region of a semiconductor wafer; and 16, a pattern region of the semiconductor wafer. Conventionally, when a resist film is formed in the pattern region 16, it is also formed in the alignment mark region 15. The resist film formed in the alignment mark region 15 generates an alignment mark position measurement error. For this reason, no resist pattern can be formed at a high precision.

In the second embodiment, a resist is applied in only part of the wafer region. More specifically, the resist is applied in the pattern region 16 without applying it in the alignment mark region 15. Therefore, a resist film 17 is selectively formed in the pattern region 16.

When the resist film 17 is selectively formed in the pattern region 16 in this manner, the wafer, a photomask, and the like can be aligned at a high precision. By performing exposure processing and developing processing, a resist pattern can be formed at a desired position in the pattern region 16.

The apparatus shown in FIG. 2 can be used to selectively apply the resist in only part of the wafer region. That is, the resist is sprayed in the pattern region 16 without being sprayed in the alignment mark region 15 by using the apparatus shown in FIG. 2.

The alignment precision in the resist pattern forming method according to the second embodiment of the present invention is compared with that in the conventional method.

Figure 9A:
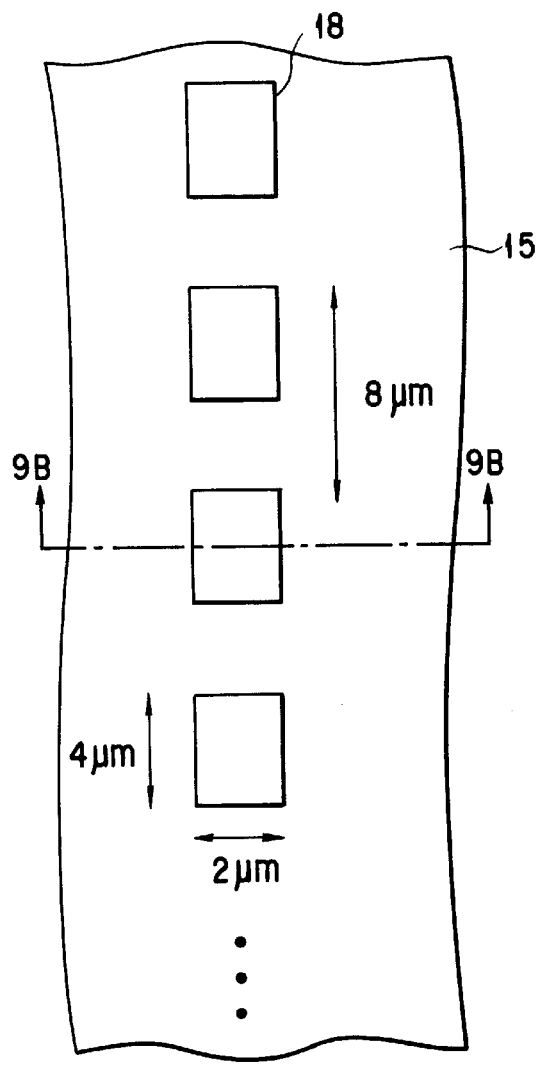
FIG. 9A is a plan view showing alignment marks laid out in an alignment mark region of a substrate used by the resist pattern forming method according to the second embodiment of the present invention.
Figure 9B:
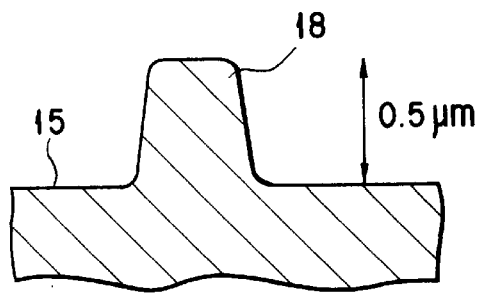
FIG. 9B is a schematic sectional view of the alignment mark shown in FIG. 9A taken along the line 9B—9B.

FIG. 9A is a plan view showing alignment marks laid out in the alignment mark region. FIG. 9B is a sectional view of the alignment mark shown in FIG. 9A taken along the line 9B—9B.

In the alignment mark region 15 shown in FIG. 8, rectangular alignment marks 18 each having a size of 4 μm×2 μm are practically laid out in a line as shown in FIG. 9A. Each alignment mark 18 is a projection having a height of 0.5 μm, as shown in FIG. 9B.

A resist is applied by the above method on a wafer except for the alignment marks 18 and their vicinity to selectively form a resist film 17 in the pattern region 16, as shown in FIG. 8.

The wafer having the resist film 17 is placed on the stage of an exposure apparatus. While the stage is moved, a laser beam having a wavelength of 633 nm is incident on the alignment marks 18. The scattered beam is detected by a CCD to perform alignment.

Figure 10A:
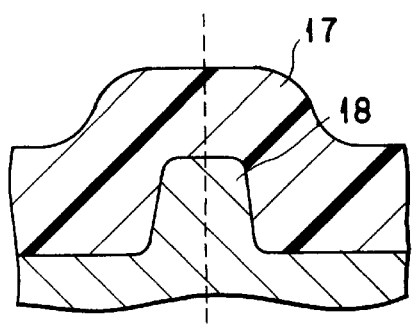
FIG. 10A is a sectional view schematically showing an alignment mark when the conventional and ideal resist pattern forming method is used.
Figure 10B:
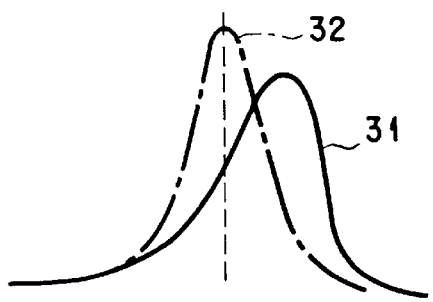
FIG. 10B is a view schematically showing the profile of scattered light from the alignment mark that is detected when the conventional resist pattern forming method is used.

According to the conventional resist pattern forming method, in forming the resist film 17 in the pattern region 16, the resist film is also formed in the alignment mark region 15. In this case, the conformal resist film 17 should be ideally formed on the alignment mark 18, as shown in FIG. 10A. However, the conformal resist film 17 is very difficult to form. In other words, the resist film 17 is formed asymmetrically about the center line of the alignment mark 18 represented by a broken line.

By an LSA (Laser Scan Alignment) method, the resist film 17 is aligned with an underlayer by analyzing the profile of scattered beam from the alignment mark 18. The resist film 17 was formed by the conventional method to be asymmetrical about the center line of the alignment mark 18. For this reason, a detected profile 31 greatly shifts and is distorted from a profile 32 supposed to be detected. Therefore, according to the conventional method, alignment cannot be performed at a high precision, and no resist pattern can be formed at a high precision.

To the contrary, when a resist film was selectively formed in the pattern region (not shown) without applying any resist on the alignment mark 18 and the vicinity, no resist film influenced a scattered beam from the alignment mark 18. That is, the detected profile 33 coincides with the profile supposed to be detected, as shown in FIG. 10D. Therefore, according to this method, alignment can be performed at a high precision, and a resist pattern can be formed at a high precision.

By selectively applying a resist in part of the substrate region, the alignment precision can be increased, and at the same time the cost can be reduced.

Above described method is not limited to forming a resist pattern. The method can be applied to forming another type of film, e.g., an ant-reflection layer and the like, and the same advantages as described above can be obtained.

Figure 11A:
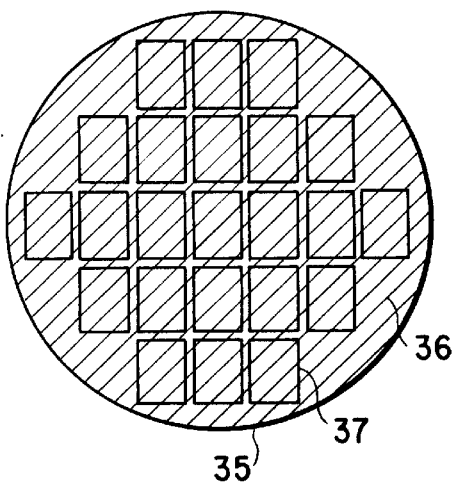
FIG. 11A is a front view schematically showing a semiconductor wafer on which a resist film is formed using the conventional resist pattern forming method.

FIG. 11A is a plan view schematically showing a semiconductor wafer with a resist film formed using the conventional resist pattern forming method. FIG. 11B is a plan view schematically showing a semiconductor wafer with a resist film formed using the resist pattern forming method according to the second embodiment of the present invention.

In FIGS. 11A and 11B, reference numeral 35 denotes a semiconductor wafer, on which a resist film 36 is formed. In FIGS. 11A and 11B, reference numeral 37 denotes an exposure shot region. The exposure shot regions 37 are laid out, as shown in FIGS. 11A and 11B, so as to obtain the maximum number of semiconductor chips from the semiconductor wafer 35. The resist film 36 is exposed by sequentially exposing the exposure shot regions 37.

By the conventional method, the resist film 36 is also formed in a region except for the exposure shot region 37, as shown in FIG. 11A. However, by the method according to the second embodiment of the present invention, the resist film 36 can be selectively formed in the exposure shot region 37, as shown in FIG. 11B. More specifically, according to the second embodiment of the present invention, the resist use amount can be reduced.

The apparatus shown in FIG. 2 can be used to selectively apply a resist in only the exposure shot region 37. That is, the resist is sprayed in the exposure shot region 37 using the apparatus shown in FIG. 2 without being sprayed in a region except for the exposure shot region 37.

The third embodiment of the present invention will be described below. In the third embodiment, a resist film is selectively formed on part of a substrate on the basis of the intensity distribution of exposure light observed at a resist film.

Figure 12:
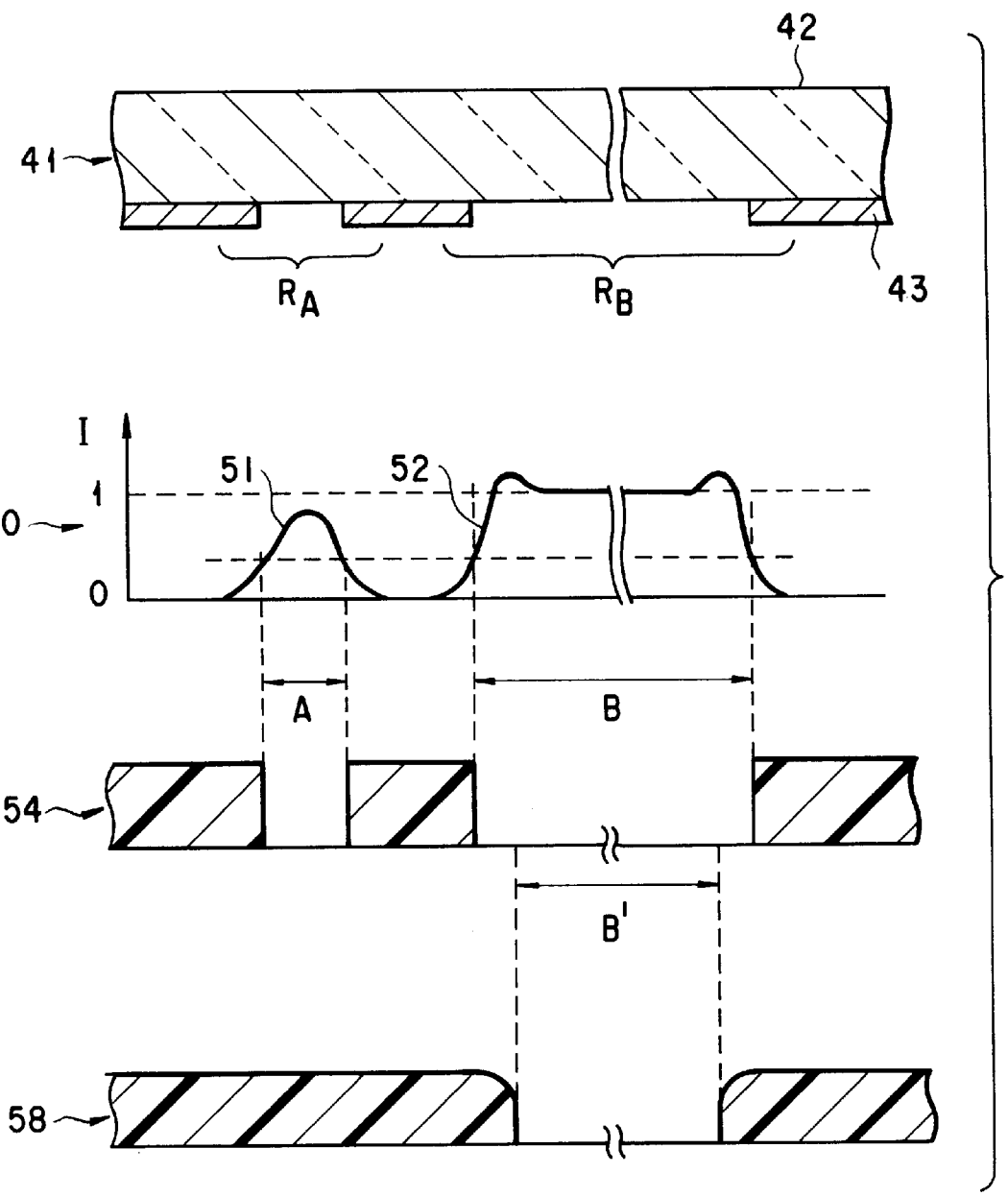
FIG. 12 is a view schematically showing an example of a resist pattern forming method according to the third embodiment of the present invention.

FIG. 12 schematically shows a resist pattern forming method according to the third embodiment of the present invention. In FIG. 12, a photomask 41, a resist pattern 54, and a resist film 58 are shown as sectional views.

The photomask 41 is constituted by forming a light-shielding pattern 43 on a transparent substrate 42. The photomask 41 is made up of a pattern portion $R_A$ and a pattern portion $R_B$ larger in pattern size than the pattern portion $R_A$.

Reference numeral 50 denotes a graph showing the intensity distribution of exposure light observed on the resist film when the resist film is irradiated with exposure light via the photomask 41. In FIG. 12, the light intensity I along the ordinate is a relative value. Note that the light intensity I is taken as 1 when substantially equal quantity of exposure light is observed at the resist film and at the photomask 41.

As shown in the graph 50, an intensity profile 51 of exposure light observed in a region corresponding to the pattern portion $R_A$ of the resist film is greatly different from an intensity profile 52 of exposure light observed in a region corresponding to the pattern portion $R_B$ of the resist film.

According to the third embodiment, a resist pattern 54 is formed by the following method. In this case, the resist pattern 54 is formed using a positive resist.

A resist film 58 is first formed on a substrate (not shown). At this time, no resist film 58 is formed in, of a region corresponding to the pattern portion $R_B$, a region having an intensity I of almost 1. A width B' of the opening of the resist film 58 is set smaller than a width B of an opening corresponding to the pattern portion $R_B$ of the resist pattern 54. With this setting, the influence of an alignment error can be reduced.

The resist film 58 is exposed using the photomask 41. The exposed resist film 58 is developed to obtain a resist pattern 54.

By the above-mentioned method, a resist pattern corresponding to the pattern portion $R_A$ having a smaller pattern size can be formed by forming a resist film having a uniform thickness on the entire substrate surface corresponding to the pattern portion $R_A$. On the other hand, a resist pattern corresponding to the pattern portion $R_B$ having a larger pattern size can be formed by selectively forming a resist film in part of the substrate region. According to the above method, the resist use amount can be reduced.

By the above method, a resist is applied in the entire region where a finer resist pattern is formed. Therefore, the resist pattern shape is hardly degraded by a spot coating method. That is, according to the above method, a resist pattern can be formed at a high precision, and the cost can be reduced.

In the third embodiment, a positive resist is used as the resist, but a negative resist can also be used. In this case, of the region corresponding to the pattern portion $R_B$, a region having an intensity I of almost 0 serves as the region where no resist film 58 is formed.

In the method according to the third embodiment, the apparatus shown in FIG. 2 can be used to form a resist film. The resist film forming method using this apparatus is the same as that described in the first and second embodiments, and a description thereof will be omitted.

In the first to third embodiments described above, the apparatus shown in FIG. 2 is used to form a resist film, but another apparatus can also be used. More specifically, any resist coating apparatus can be used as far as a resist film can be formed with a desired thickness and a desired pattern.

As has been described above, according to the resist pattern forming method of the present invention, a resist film is formed to have different thicknesses between part of the region and the remaining region in accordance with the pattern size and pattern density of a photomask. Optimum exposure conditions (an exposure dose and a focus) or allowable exposure conditions depend on the thickness of the resist film. The two regions can therefore be exposed under optimum conditions. Alternatively, the overlapping allowable exposure condition ranges in the regions can be increased.

According to the resist pattern forming method of the present invention, a resist pattern can be formed at a high precision. In addition, the throughput can be increased.

According to the resist pattern forming method of the present invention, a resist film is selectively formed in part of a substrate region by applying a resist in part of the region without applying the resist in the remaining region. If the resist film is formed without applying the resist on an alignment mark, the alignment precision in exposure can be increased. If the resist film is selectively formed in an exposure shot region, the resist use amount can be reduced to reduce the cost.

According to the resist pattern forming method of the present invention, a resist film is selectively formed on part of a substrate on the basis of the intensity of exposure light observed at the resist film. Therefore, the resist use amount can be reduced to reduce the cost. According to the resist pattern forming method of the present invention, a resist is applied on the entire surface of a region where a finer resist pattern is formed. Accordingly, the resist pattern shape is hardly degraded by a spot coating method. In other words, a resist pattern can be formed at a high precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A resist pattern forming method, said resist pattern having a first region and a second region different in at least one of a pattern size and a pattern density from said first region, comprising the steps of:

forming a resist film on one major surface of a substrate;

irradiating said resist film with exposure light via a photomask to expose said resist film; and developing said exposed resist film, wherein said photomask includes:

a first pattern portion corresponding to said first region and having a light-transmitting portion, and a second pattern portion corresponding to said second region, having a light-transmitting portion, and being different in at least one of a pattern size and a pattern density from said first pattern portion; wherein
the step of forming said resist film is performed such that a thickness of said first region and a thickness of said second region are different from each other.

2. A method according to claim 1, wherein the thicknesses of the first and second regions are respectively determined on the basis of an intensity of the exposure light observed at a position corresponding to said light-transmitting portion of said first pattern portion in the first region, and an intensity of the exposure light observed at a position corresponding to said light-transmitting portion of said second pattern portion in the second region.

3. A method according to claim 1, wherein said resist film is formed by a spot coating method.

4. A method according to claim 1, wherein at least a part of said first pattern portion has a Levenson phase-shifting mask structure, said second pattern portion has a non-phase shifting mask structure, said light-transmitting portion of said first pattern portion has a smaller pattern size than a pattern size of said second pattern portion, and the second region is made thinner than the first region.

5. A method according to claim 1, wherein said light-transmitting portion of said first pattern portion has a smaller pattern size than a pattern size of said second pattern portion, and the first region is made thinner than the second region.

6. A resist pattern forming method comprising the steps of:

selectively applying a resist to a part of one major surface of a semiconductor substrate to form a resist film such that an applied region, where said resist is applied, and a non-applied region, where said resist is not applied, are formed in the major surface of the substrate;

exposing said resist film using a photomask; and developing said exposed resist film, wherein said method satisfies at least one condition selected from the group consisting of:
a first condition that one major surface of said substrate comprises an alignment mark used for alignment in the exposing step and the non-applied region includes said alignment mark; and
a second condition that said applied region includes a region corresponding to a plurality of semiconductor chips formed from said semiconductor substrate.

7. A method according to claim 6, wherein said resist film is formed by a spot coating method.

8. A resist pattern forming method comprising the steps of:

forming a resist film on one major surface of a substrate;

irradiating said resist film with exposure light via a photomask to expose said resist film, and developing said exposed resist film, wherein said resist film is made by using a positive resist, said major surface of the substrate consists of a first region where an intensity substantially equal to an intensity of the exposure light incident on said photomask is observed, and a second region other than said first region, and said resist film forming step comprises applying said resist on the second region, without applying on at least part of the first region.

9. A method according to claim 8, wherein said resist film is formed by a spot coating method.

10. A resist pattern forming method comprising the steps of:

forming a resist film on one major surface of a substrate, irradiating said resist film with exposure light via a photomask to expose said resist film, and developing said exposed resist film, wherein said resist film is made by using a negative resist, said major surface of the substrate consists of a first region where an intensity of the exposure light observed is substantially equal to zero, and a second region other than said first region, wherein
said resist film forming step comprises applying said resist on the first region, without applying said resist on at least part of the second region.

11. A method according to claim 10, wherein said resist film is formed by a spot coating method.

* * * * *